US006897628B2

(12) United States Patent
Gunnerman et al.

(10) Patent No.: US 6,897,628 B2
(45) Date of Patent: May 24, 2005

(54) HIGH-POWER ULTRASOUND GENERATOR AND USE IN CHEMICAL REACTIONS

(75) Inventors: Rudolf W. Gunnerman, Reno, NV (US); Charles I. Richman, Reno, NV (US)

(73) Assignee: SulphCo, Inc., Sparks, NV (US)

( * ) Notice: Subject to any disclaimer, the term of this patent is extended or adjusted under 35 U.S.C. 154(b) by 0 days.

(21) Appl. No.: 10/440,445

(22) Filed: May 16, 2003

(65) Prior Publication Data

US 2004/0227414 A1 Nov. 18, 2004

(51) Int. Cl.[7] .......................... H01L 41/06; H01L 41/12

(52) U.S. Cl. .......................................... 318/118; 310/26

(58) Field of Search ................................ 318/114, 126, 318/127, 128; 310/26

(56) References Cited

U.S. PATENT DOCUMENTS 4,168,295 A 9/1979 Sawyer ....................... 422/111
4,531,934 A 7/1985 Kossovsky et al. ........... 604/22
4,556,467 A 12/1985 Kuhn et al. ................. 204/193
4,563,837 A 1/1986 Ono ........................... 451/124
4,579,000 A * 4/1986 Sudo ........................... 73/654
5,057,182 A * 10/1991 Wuchinich ............... 156/580.1
5,208,787 A 5/1993 Shirley ....................... 367/139
5,238,335 A 8/1993 Nomura ....................... 408/59
5,360,498 A 11/1994 Blomqvist et al. ......... 156/73.1
5,486,733 A 1/1996 Yamazaki et al. ..... 310/323.18
5,854,589 A 12/1998 How et al. .................. 340/551
6,188,186 B1 2/2001 Kong et al. ................. 318/118
6,545,060 B1 4/2003 Ruhman et al. .............. 521/41
6,720,684 B2 * 4/2004 Czimmek .................... 310/26

FOREIGN PATENT DOCUMENTS

JP 08 318419 A 12/1996 ............. B23C/5/28
WO WO 95/24999 A1 9/1995 ........... B29B/13/08
WO WO 98/22277 A1 5/1998 ........... B29H/19/00

OTHER PUBLICATIONS

Nyce, "Magnetostrictive Position Transducers in Medical Applications", MTS Systems Corporation Technical Paper pp. 1–5, date unknown.

"Magnetostrictive Linear Position Sensors: How they work", http://www.sensorland.com/HowPage024.html, date unknown.

(Continued)

*Primary Examiner*—Thanh Lam
*Assistant Examiner*—Judson H. Jones
(74) *Attorney, Agent, or Firm*—M. Henry Heines; Townsend and Townsend and Crew, LLP

(57) ABSTRACT

Ultrasound for use in promoting a chemical reaction is generated by an electromagnet formed from a pair of magnetostrictive prongs wound with coils that are oriented to produce an oscillating magnetostrictive force when an oscillating voltage is applied, in conjunction with a sensing electromagnet of magnetostrictive material that is arranged to receive the vibrations generated by the driving electromagnet and produce internal magnetic field changes due to the reverse magnetostrictive effect. These field changes generate voltages that are representative of the amplitude of the oscillating magnetostrictive force. The generated voltage is compared to a target value in a control circuit that adjusts the applied oscillating voltage accordingly. The oscillations in the prongs of the electromagnet are transmitted to an ultrasonic horn that is immersed in the reaction medium to provide direct contact with the reaction mixture.

43 Claims, 6 Drawing Sheets

OTHER PUBLICATIONS

"Welcome to Magnetostrictive Transducers, Actuators, and Sensors @ Iowa State University . . . ", http://www.public.iastate.edu/–terfenol/homepage.html, date unknown.
Group Arnold, "Soft Magnetics Application Guide", p. 30.1–p. 30.37, (Mar. 2000).
Dorf, "Electrical Engineering Handbook" IEEE Press ISBN 0–8493–0185–8 (1993), month unknown.
Advanced Chemistry Labs, Inc., "List of Parameters and Methods", pp. 1–6, date unknown.
"Giant Magnetostriction", http://www.tf.uni–kiel.de/matwis/amat/elmat__en/kap__6/advanced/t6__3__2.html, date unknown.

"Magnetostriction: Why does the transformer hum ?", http://hyperphysics.phy–astr.gsu.edu/hbase/solids/magstrict.html, date unknown.

"Magnetostriction", http://www.physics.hull.ac.uk/magnetics/Research/Facilities/Magnetostriction/magnetostrict . . . , date unknown.

Bulova, "Tuning Fork Watches", http://216.239.37.104/search?q+cache:Nyw__QGFgFN4C:www.iit.edu/–matleri/bulova.html . . . , date unknown.

* cited by examiner

HIGH-POWER ULTRASOUND GENERATOR AND USE IN CHEMICAL REACTIONS

BACKGROUND OF THE INVENTION

1. Field of the Invention

This invention resides in the field of process equipment used in the treatment of materials in liquid media by ultrasound.

2. Description of the Prior Art

The use of ultrasound for driving chemical reactions is well known. Examples of publications that describe chemical uses of ultrasound are Suslick, K. S., *Science*, vol. 247, p. 1439 (1990), and Mason, T. J., *Practical Sonochemistry, A User's Guide to Applications in Chemistry and Chemical Engineering*, Ellis Norwood Publishers, West Sussex, England (1991). Of the various sonicating systems that have been developed, those known as "probe"-type systems include an ultrasonic transducer that generates ultrasonic energy and transmits that energy to an ultrasonic horn for amplification.

Ultrasound generators are generally of limited energy output due to the power needed to drive the vibrations and the heat generated by ultrasonic transducers. Because of these limitations, the use of ultrasound for large-scale chemical processes has met with limited success. One means of achieving ultrasonic vibrations at a relatively high power is by the use of magnetostriction-driven ultrasound transducers, but frequencies attainable by magnetostriction drives are still only moderate in magnitude. Disclosures of the magnetostriction ultrasound transducers and their use in chemical reactions appear in Ruhman, A. A., et al. U.S. Pat. No. 6,545,060 B1 (issued Apr. 8, 2003), and its PCT counterpart WO 98/22277 (published May 28, 1998), as well as Yamazaki, N., et al. U.S. Pat. No. 5,486,733 (issued Jan. 23, 1996), Kuhn, M. C., et al. U.S. Pat. No. 4,556,467 (issued Dec. 3, 1985), Blomqvist, P., et al. U.S. Pat. No. 5,360,498 (issued Nov. 1, 1994), and Sawyer, H. T., U.S. Pat. No. 4,168,295 (issued Sep. 18, 1979). The Ruhman et al. patent discloses a magnetostriction transducer that produces ultrasonic vibrations in a continuous-flow reactor in which the vibrations are oriented radially relative to the direction of flow and the frequency range is limited to a maximum of 30 kHz. The Yamazaki et al. patent discloses a small-scale ultrasonic horn operating at relatively low power, in which magnetostriction is listed as one of a group of possible vibration-generating sources together with piezoelectric elements and electrostrictive strain elements. The Kuhn et al. patent discloses a continuous-flow processor that includes a multitude of ultrasonic horns and generators supplying frequencies less than 100 kHz. The Blomqvist et al. patent discloses an ultrasonic generator utilizing a magnetostrictive powder composite operating at a resonance frequency of 23.5 kHz. The Sawyer et al. patent discloses a flow-through reaction tube with three sets of ultrasonic transducers, each set containing four transducers and delivers ultrasound at a frequency of 20 to 40 kHz. These systems are not suitable for high-throughput reactions where a high reaction yield is required.

SUMMARY OF THE INVENTION

It has now been discovered that ultrasound can be supplied to a reaction system at high energy and high frequency by an ultrasound generator driven by a magnetostriction ultrasound transducer that includes a driving electromagnet formed from a pair of magnetostrictive prongs wound with coils that are oriented to produce an oscillating magnetostrictive force that produces ultrasonic vibrations in the prongs when an oscillating voltage is applied. The vibrations in the driving magnet produce magnetic field changes in the sensing magnet by a reverse magnetostrictive effect known in the art as the Villari effect, and these magnetic field changes generate a voltage in a coil that is wound around the sensing magnet. The voltage is representative of the amplitude of the oscillating magnetostrictive force in the driving magnet, and is compared to a target value in a control circuit that makes appropriate adjustments to the oscillating voltage applied to the driving magnet. The ultrasonic vibrations in the prongs of the driving magnet are also transmitted to an ultrasonic horn that is immersed in the liquid reaction medium to provide direct contact with the reactant(s). The prongs of the driving magnet are large enough to withstand a voltage as high as 300 volts and frequencies that are well into the megahertz range. The generator can be configured for use in a continuous-flow reactor, where it will accommodate a high-throughput reaction system, and a single such generator is preferably used as the sole source of ultrasound energy supplied to the reactor.

It has also been discovered that a highly efficient conversion of electrical energy to ultrasonic energy is achieved when the applied voltage is a pulsewise voltage with a rectangular waveform that consists of periods of positive voltages separated by periods of negative voltage rather than a zero voltage baseline.

This invention thus resides in an ultrasonic vibration generator as well as a continuous-flow reactor which incorporates the ultrasonic vibration generator, and also in a method for performing a chemical reaction with the assistance of ultrasound by passing a reaction medium in liquid form through a flow-through reactor that incorporates the ultrasonic vibration generator. This invention is useful in any chemical reaction whose yield and/or reaction rate can be enhanced by ultrasound, and is particularly useful in the desulfurization of crude oil and crude oil fractions, in processes disclosed in commonly owned U.S. Pat. No. 6,402,939 (issued Jun. 11, 2002), U.S. Pat. No. 6,500,219 (issued Dec. 31, 2002), U.S. Published Patent Application No. US 2003-0051988 A1 (published Mar. 20, 2003), U.S. patent application Ser. No. 10/279,218 (filed Oct. 23, 2002), and U.S. patent application Ser. No. 10/326,356 (filed Dec. 20, 2002). All patents, patent applications, and publications in general that are cited in this specification are incorporated herein by reference in their entirety for all legal purposes that are capable of being served thereby.

DETAILED DESCRIPTION OF THE INVENTION AND PREFERRED EMBODIMENTS

Figure 1:
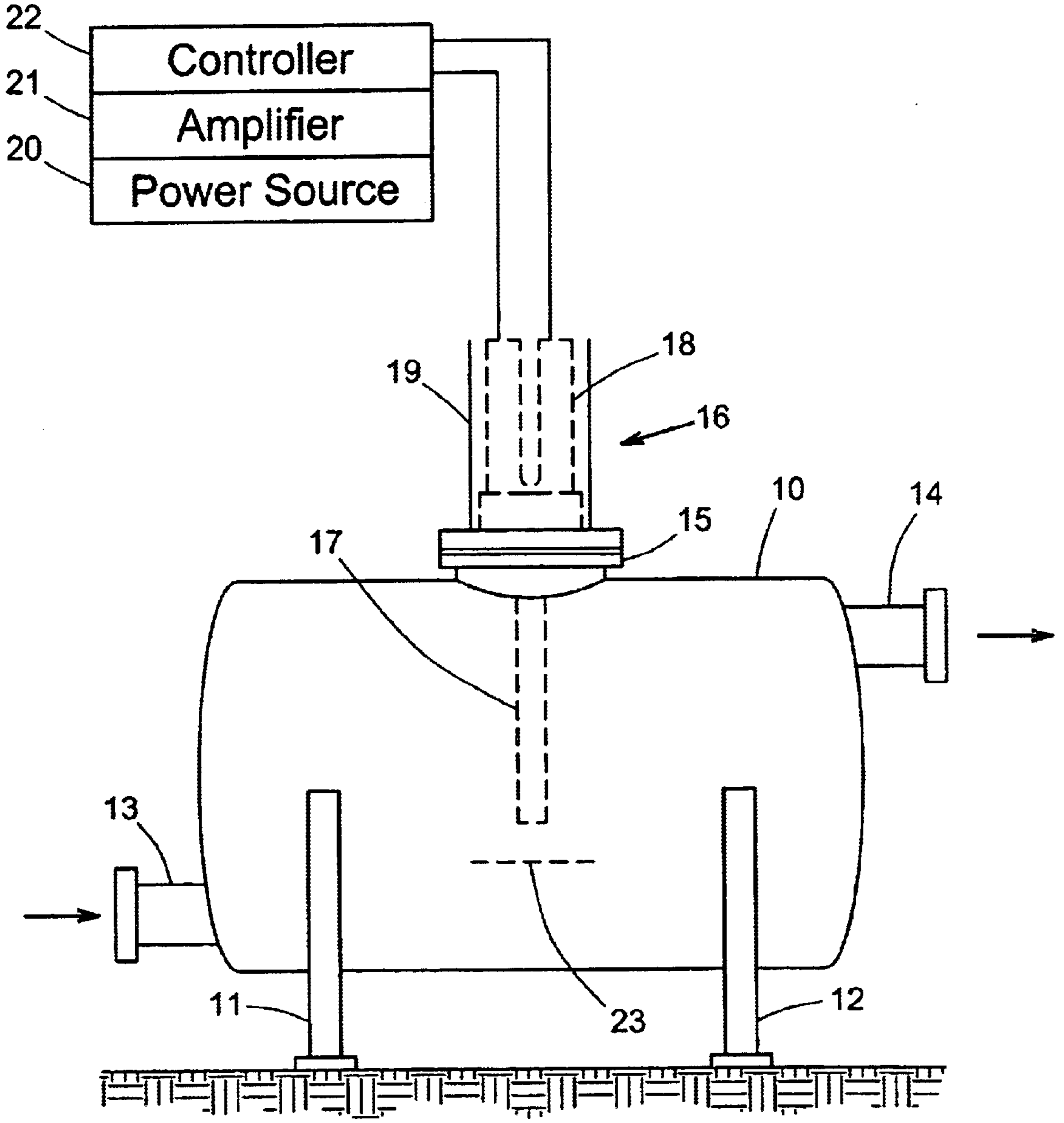
FIG. 1 is a side view of a continuous-flow reactor to which is mounted an ultrasound generator in accordance with the present invention.

In accordance with this invention, ultrasonic vibrations are transmitted to an ultrasonic horn by a transducer that converts periodically varying voltages to mechanical vibrations in the ultrasound range by way of magnetostriction. The drive prongs in the transducer thus operate as electromagnets and are preferably formed of a material that is a soft magnetic alloy as well as a magnetostrictive material. A soft magnetic alloy is one that becomes magnetic in the presence of an electric field but retains little or no magnetism after the field is removed. Soft magnetic alloys are well known, and any such alloy is suitable for use in the present invention. Examples are iron-silicon alloys, iron-silicon-aluminum alloys, nickel-iron alloys, and iron-cobalt alloys, many of these containing additional alloying elements such as chromium, vanadium, and molybdenum. Examples of trade names under which these alloys are sold are HIPERCO® 27, HIPERCO® 35, 2V PERMENDUR®, and SUPERMENDUR. A presently preferred alloy is H ERCO® Alloy 50A (High Temp Metals, Inc., Sylmar, Calif., USA). A magnetostrictive material is one that undergoes a physical change in size or shape as the result of the application of a magnetic field. Magnetostrictive materials are likewise well known in the art, as are materials that are both magnetostrictive and soft magnetic alloys. The sensing magnet is made of the same types of materials as the drive prongs, and both can be made of the same alloy.

The size of each drive prong can vary depending on the energy needed to achieve the conversion or yield sought in the chemical reaction. In most cases, suitable drive prongs will be from about 5 to about 50 cm in length, and preferably from about 10 to about 25 cm in length, with volumes of from about 100 to about 1,000 $cm^3$ per prong, and preferably from about 250 to about 500 $cm^3$ per prong. The sensing magnet is preferably made of a pair of sensing prongs, whose size may vary as well, and in most cases, suitable sensing prongs will have the same length ranges as the drive prongs, whereas suitable volumes of the sensing prongs will most often range from about 10 to about 300 $cm^3$ and preferably from about 30 to about 100 $cm^3$. Due to the limitations of the properties of soft magnetic alloys that are commercially available and to the desirability of having the magnetic moments in proper and uniform alignment in these alloys, the prongs are preferably manufactured from thin plates stacked together. Individual plates may for example range in thickness from about 0.1 cm to about 1.0 cm, or preferably from about 0.25 cm to about 0.6 cm, and can be joined by any conventional adhesive that is strong enough to withstand the high localized temperatures and mechanical stresses that the vibrations can generate. Ceramic adhesives are particularly useful in this regard. For convenience in manufacturing, each pair of prongs is preferably connected by a crossbar to form a unitary U-shaped piece similar in appearance to a horseshoe magnet, i.e., the drive prongs preferably form a U-shaped drive magnet and the sensing prongs preferably form a U-shaped sensing magnet.

The windings around the various prongs are arranged and oriented to serve the drive and sensing functions of the prongs. The windings around the drive prongs, for example, are preferably in opposing directions so that when a voltage is applied across both windings the magnetic polarities arising from the resulting current are in opposite directions and magnetostrictive forces are created in a direction parallel to the axes of the prongs. Conversely, the windings around the sensing prongs are preferably a single winding that encircles one prong and continues to the other prong, i.e., the windings around the two prongs are in series. Both prongs are preferably wound to have the same magnetic polarity and the sensing magnet as a whole will respond to the vibrations produced by the driving magnet with a reverse magnetostrictive effect that generates magnetic field changes in the sensing prongs. These magnetic field oscillations then produce a voltage in the coils around the sensing prongs.

The ultrasonic horn can be of any conventional shape and size that may be known in the prior art for ultrasonic horns in general. The horn may for example be rod-shaped, preferably of circular cross section, and suitable lengths may range from about 5 cm about 10 cm, depending on the reactor size, and preferably from about 10 cm to about 50 cm, with a diameter of from about 3 cm to about 30 cm, and preferably from about 5 cm to about 15 cm. The drive prongs are operatively joined to the horn, i.e., by a mechanical connection that transmits the mechanical vibrations of the prongs to the horn. Metals from which the horn can be made are well known in the art of ultrasound. Examples are steel, stainless steel, nickel, aluminum, titanium, copper, and various alloys of these metals. Aluminum and titanium are preferred.

The transducer can be powered by any oscillating voltage. The oscillations can be a continuous waveform oscillation such as sinusoidal wave or a series of pulses such as rectangular waveform pulses. By "rectangular waveform" is meant a direct current voltage that alternates between a constant positive value and a baseline with stepwise voltage changes in between. Rectangular waveforms that are preferred in the practice of this invention are those in which the baseline is a negative voltage rather than a zero voltage, and preferably those in which the alternating positive and negative voltages are of the same magnitude. Preferred voltage is from about 140 volts to about 300 volts, and preferably about 220 volts single-phase, and the preferred wattage is from about 12 kilowatts to about 20 kilowatts. The frequency of the voltage oscillation will be selected to achieve the desired ultrasound frequency. Preferred frequencies are in the range of about 10 to about 30 megahertz, with a range of about 17 to about 20 megahertz more preferred.

Ultrasound transducers in accordance with this invention will typically require cooling during use. Cooling of the drive and sensing prongs can conveniently be achieved by surrounding these prongs in a jacket or housing through which a coolant is passed or circulated. The ultrasound generator is preferably mounted to a reaction vessel with the ultrasound horn protruding into the vessel interior and the drive and sensing prongs and the coolant jacket resides outside the vessel. Water is generally an acceptable and convenient coolant medium and is preferably circulated through the coolant jacket in a circulation loop that is separated from the reaction mixture passing through the reactor.

Ultrasound generators in accordance with this invention can be used in either batch reactors on a batch basis or in continuous-flow reactors in a continuous process. Continuous-flow reactors are preferred.

While this invention is susceptible to a variety of implementations and configurations, a detailed study of specific embodiments will provide the reader with a full understanding of the concepts of the invention and how they can be applied. One such embodiment is shown in the Figures.

FIG. 1 is a side view of a continuous-flow reactor 10 in which flowing reaction mixture is exposed to ultrasound in accordance with this invention. The reactor is supported by struts 11, 12 and designed to be placed on-line in a continuous-flow chemical process such as a petroleum refining plant or any such plant in which a liquid reaction mixture would benefit from ultrasound treatment. The reaction mixture enters the reactor through an inlet port 13 and leaves the reactor through an outlet port 14 the ports arranged in the reactor to promote full flow through the reactor while avoiding or minimizing regions of stagnation of the reaction mixture. A flange 15 on one side of the reactor permits the attachment of an ultrasound device 16 which includes an ultrasonic horn 17 that extends into the interior of the reactor (and is therefore shown in dashed lines). The electrical and magnetic components 18 of the ultrasound device, which are operatively joined to the ultrasound horn 17 are contained in a housing 19 (the electrical and magnetic components therefore being represented by dashed lines) that does not extend into the reactor 10 but instead extends outward from the reactor exterior. A coolant circulates through the housing (by means not shown in this Figure), and electrical connections join the components inside the housing to an external power source 20 supplying direct current voltage, an amplifier 21 that converts the voltage into pulses, and a computer/controller 22 that controls the pulse parameters that are sent to the ultrasound device in relation to sensing signals received from the sensing components of the ultrasound device. The various components and their functions are described in more detail below in the discussions of the succeeding Figures. A further feature of the reactor 10 is a metallic grid 23 mounted in the interior of the reactor to serve as a catalyst for the reaction that is promoted by the ultrasound. When the reaction is one involving desulfurization of petroleum or the conversion of sulfur-containing compounds in general, a preferred grid is one containing silver and tungsten, for example silver wire in one direction and tungsten wire in a direction transverse to the silver wire. The grid is securely fixed to the reactor interior by conventional means.

Figure 2:
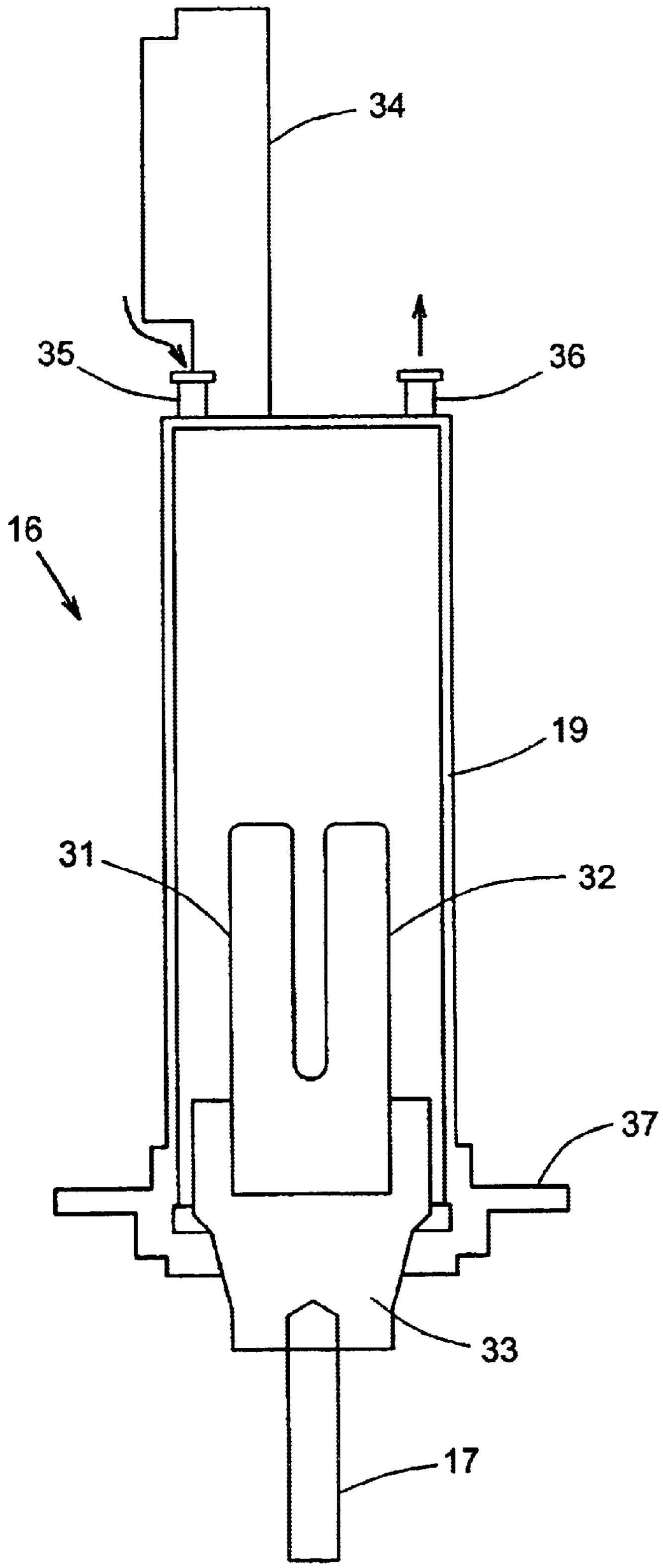
FIG. 2 is a cross-section view of the ultrasound generator of FIG. 1.

FIG. 2 is a cross section of the ultrasound device 16, showing the coolant chamber/housing 19 and its interior, including the profile of the drive prongs 31, 32. The prongs are secured to a block 33 that transmits the magnetostrictive vibrations generated in the prongs 31, 32 to the horn 17. The prongs are secured to the block by way of recesses in the block and held in place by any conventional means that will transmit the maximum amount of vibrational energy. In a preferred embodiment, silver solder is used to bond the prongs to the block. The windings around the probes are not shown in this view but are instead shown in succeeding Figures and discussed below. A junction box 34 is mounted to the exterior of the coolant chamber/housing 19 and provides the electrical connections between the windings and the power source 20, amplifier 21, and computer 22 shown in FIG. 1. Ports for the inlet 35 and outlet 36 of a circulating coolant allow the interior of the coolant chamber/housing to be continuously flushed with water or any other suitable coolant. A flange 37 serves as a mounting structure to secure the device to the flange 15 on the reactor 10 (FIG. 1).

Figure 3:
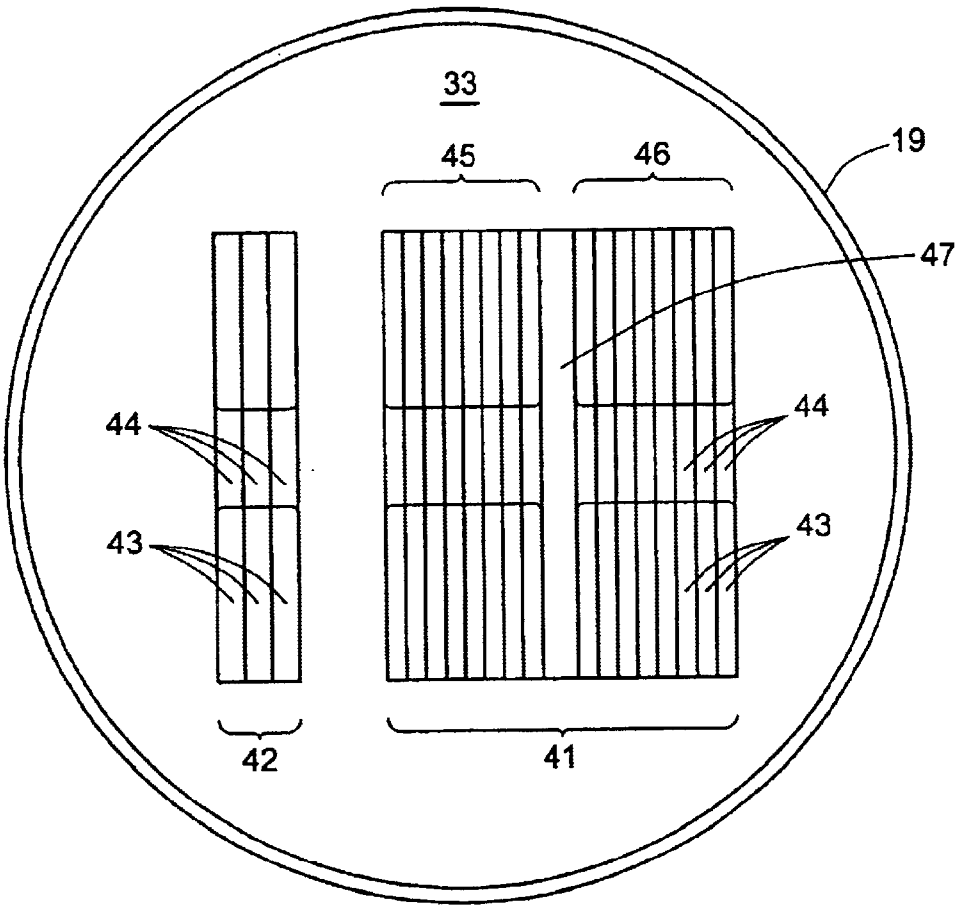
FIG. 3 is an end view of the prongs of the electromagnets that are part of the ultrasound generator of FIG. 2.

FIG. 3 provides an end view of the magnetic components. The components include drive prongs 41 and sensing prongs 42. Each of the prongs is a stack of individual plates 43 of a soft magnetic alloy bonded together with an appropriate adhesive. Each plate is U-shaped with two prongs joined at one end by a crossbar 44. The plates of the drive prongs 41 are divided into two groups 45, 46 with a gap 47 in between to facilitate cooling by providing additional surface area for contact with the circulating coolant.

Figure 4:
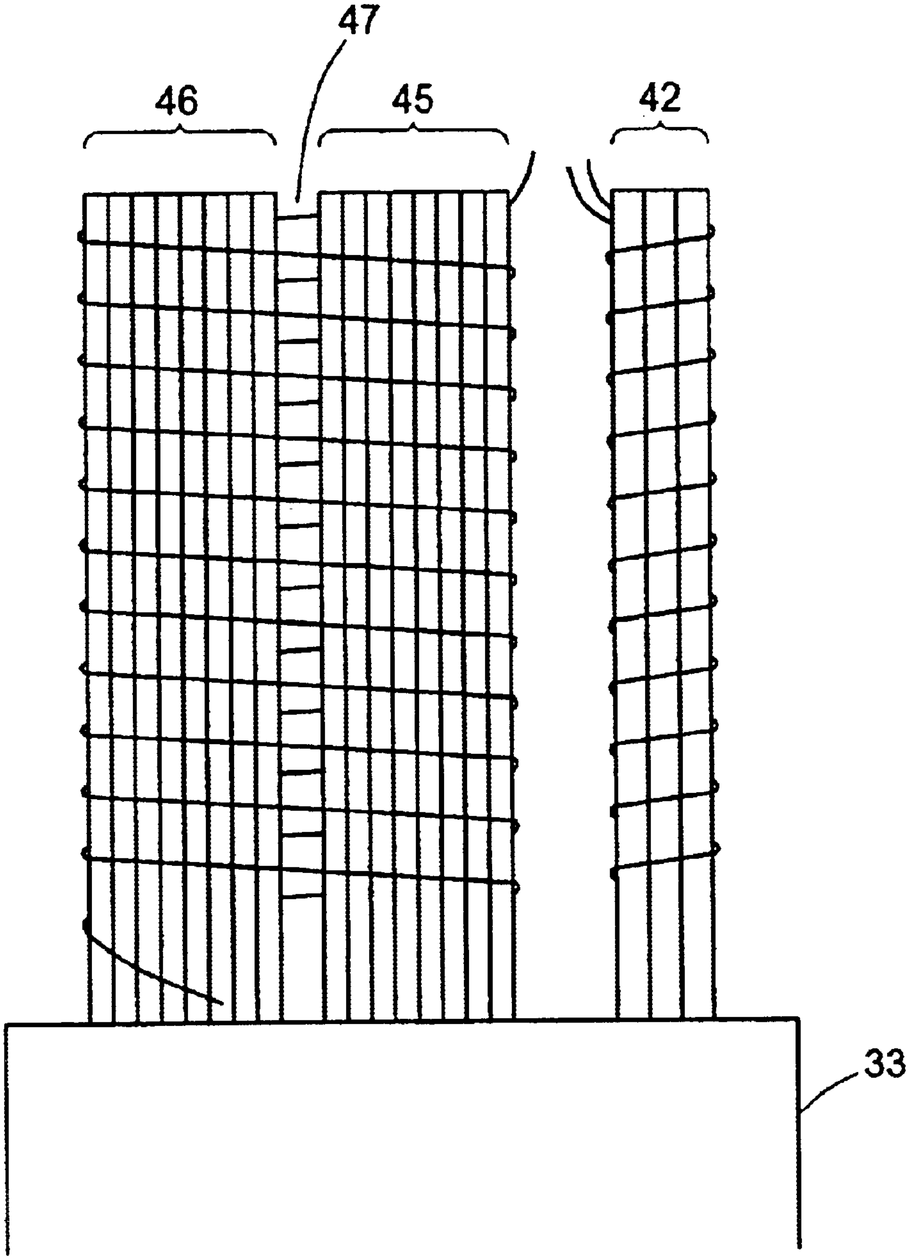
FIG. 4 is a side view of the prongs of FIG. 3.
Figure 5:
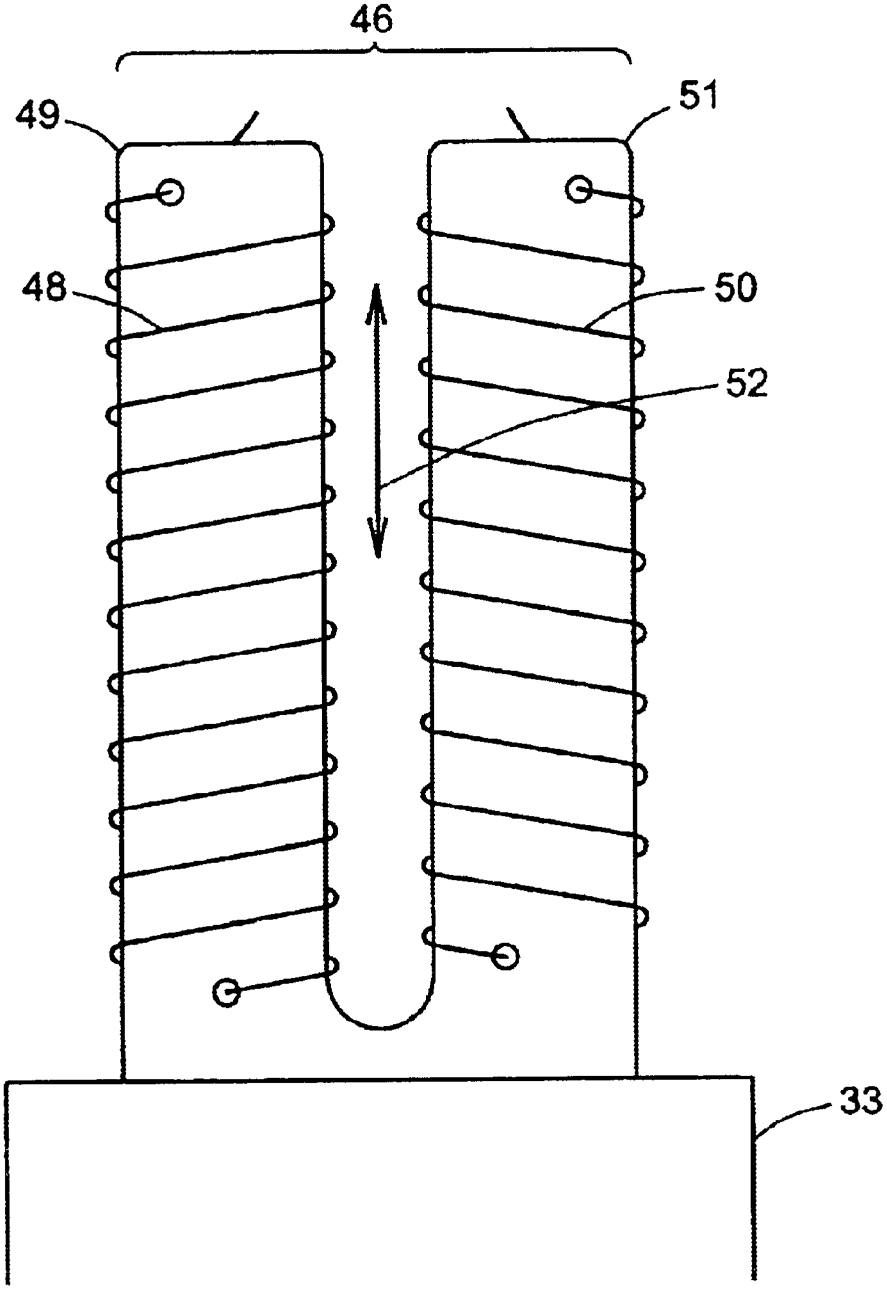
FIG. 5 is a further side view of the drive prongs of FIG. 3, rotated 90° relative to the view of FIG. 3.
Figure 6:
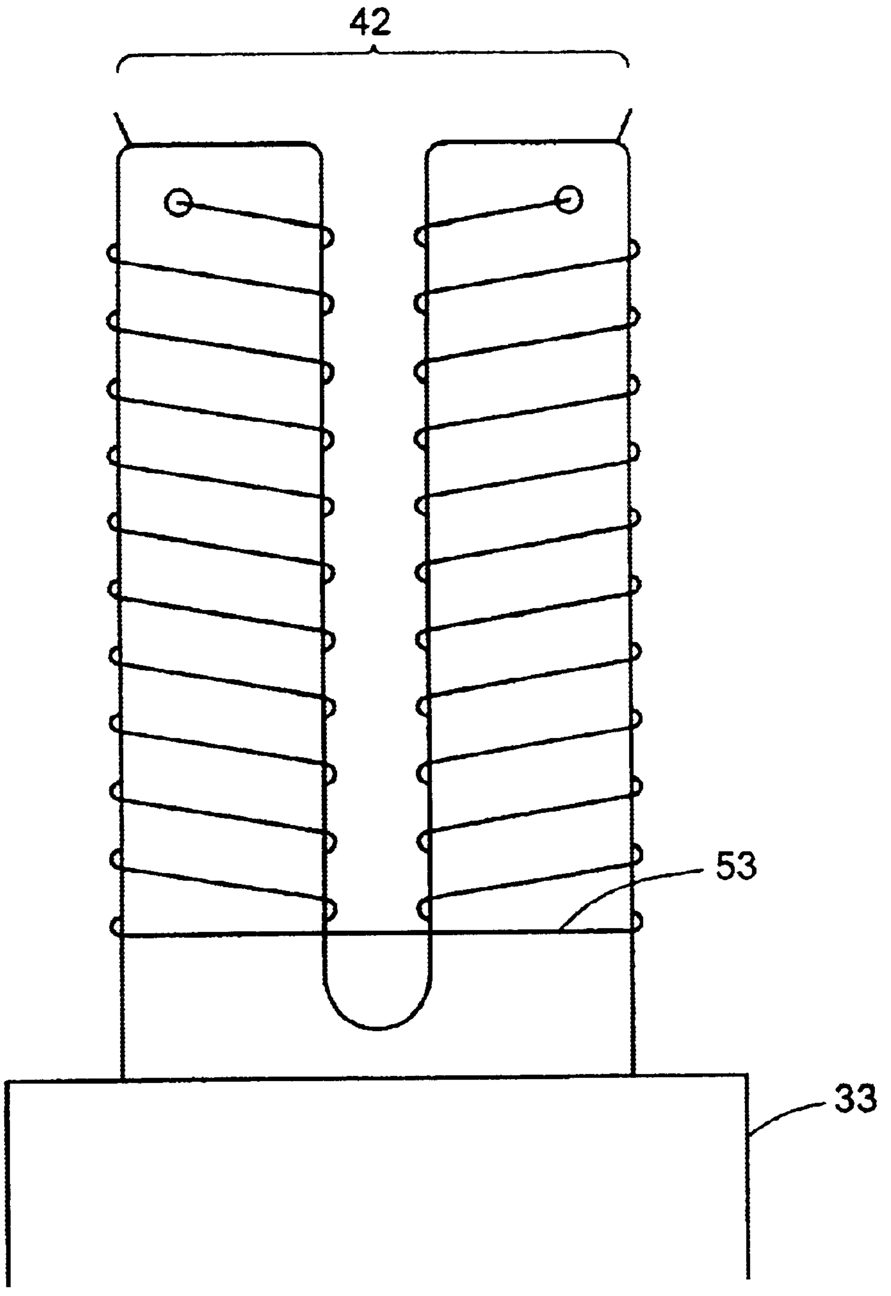
FIG. 6 is a further side view of the sensing prongs of FIG. 3, rotated 90° relative to the view of FIG. 3.

The windings are shown in the side views of the prongs presented in FIGS. 4, 5, and 6. The view of FIG. 4 faces the edges of the prong plates while the views in FIGS. 5 and 6 face the broad surfaces of the plates.

The windings around the drive prongs are visible in FIGS. 4 and 5. As shown in these Figures, the windings around of each leg of the U-shaped plate stack that forms the drive prongs are separate from the windings around the other leg of the same plate stack, while each leg has a single winding that encircles both groups of plates 45, 46 of the stack. Thus, a single coil of wire 48 encircles all plates forming the left drive prong 49 (FIG. 5), including spanning the gap 47 between the two groups of plates, and another, independent, single coil 50 encircles all plates forming the right prong 51, including spanning the gap 47. The two coils 48, 50 are wound in opposite directions, and voltages are applied in such a manner that the magnetic polarity generated in one prong by the current in the winding encircling that prong is opposite to the magnetic polarity generated in the other prong while magnetostrictive forces are generated in the direction indicated by the arrow 52.

The windings around the sensing prongs 42 are visible in FIGS. 4 and 6. A continuous winding 53 is used that encircles one prong and then continues to the other. With this winding, the changing magnetic fields generated by the drive magnets create a voltage in the winding by magnetic induction, with substantially no magnetostriction effect.

The power components, including the power supply, the amplifier, and the controller, are conventional components available from commercial suppliers and readily adaptable to perform the functions described above. In currently preferred embodiments, an arbitrary waveform generator such as Agilent 33220A, Agilent 3325A, or Advantek 712 with multifunction DAC 4-channel and AC 15 single-ended channels can be used, together with A/D temperature sensors to detect faults and power surges. Other components are a high-power push-pull amplifier with two Mitsubishi-QM200HA-2H Darlington transistors, rated 200A and 1,000V, or an IGBT (insulated gate bipolar transistor). An NPN configuration at 220V DC and 100A is used to generate power in the drive coils at 25 kW, and two positive pulse trains are used for driving the NPN transistors separately. Two transistors with NPN characteristics can be used in a push-pull amplifier. A PNP inverting state is used before the gate of the negative power transistor to develop a true push-pull power amplifier that will drive the driving electromagnet circuit. The pulse that drives the high-power amplifier can be adjusted to maximize the ultrasonic power. For the sensing components, a magnetic deflection circuit powers a transducer tip deflection foil with dc power and measures an ac return pulse. The arbitrary waveform generator is auto-tuned by a DAC and AD card in a Lab-View computer, in which pulse software controls the arbitrary waveform generator to maximize the ultrasonic output by adjusting the pulse frequency to the transducer resonance frequency. The positive and negative pulse components can also be adjusted to give an overall DC component that will maximize the magnetostrictive effect.

The following examples are offered for purposes of illustration only.

EXAMPLES

This example illustrates the use of an ultrasound generator in accordance with the present invention in the treatment by crude oil.

A reactor having the configuration shown in the Figures with a diameter of 8 inches (20 cm) and a length of 12 inches (30 cm) was used, with inlet and outlet ports having diameters of approximately 2 inches (5 cm), an ultrasound generator with a solid aluminum horn measuring 5.5 inches (14.0 cm) in length and 3.75 inches (9.5 cm) in diameter. The drive and sensing magnets were made from plates of PERMENDUR® (Hiperco Alloy 50A), each prong measuring 5.8 inches (14.8 cm) in length (total length, including crossbar, of 9 inches or 23 cm), 1.36 inch (2.4 cm) in width, and 0.14 inch (0.37 cm) in thickness, with seventeen such plates forming the drive prongs and three such plates forming the sensing prongs. The plates were annealed at approximately 1,600° F. (870° C.) for several hours, then cooled in a vacuum, prior to bonding. The block was annealed at 1,700° F. (930° C.) for several hours before the plates were silver-soldered into the block. The wire used for winding around the drive prongs was 12–14 gauge wire, and the wire used for winding around the sensing magnets was 14–16 gaueg wire, both with high-temperature insulation. The drive magnets were driven by a power supply at 4 kW at 220 V single-phase, and a positive-negative pulse at a frequency of 17–20 mHz. The feed to the reactor was a 50:50 (volume ratio) emulsion of crude oil and water, supplemented with diethyl ether and kerosene (2.2:19.8 volume ratio), at a total flow rate of 0.97 gallons per second (3.7 L/sec) with the diethyl ether and kerosene mixture supplied at 22 mL per second.

The reaction mixture leaving the reactor was separated into aqueous and organic phases by centrifuge, and the organic phase was washed once-through with water in a shear mixer at 3100 rpm for thirty seconds, then separated again. The starting material, first-run product (prior to washing), and wash product were each fractionated to determine the relative amounts of gasoline ($C_4$–$C_{14}$), diesel ($C_9$–$C_{24}$), and oil ($C_{18}$–$C_{34}$) fractions, and the results in volume percents are listed in Table I.

TABLE I

Fractionation Results

| Fraction | Volume Percents: Starting Material | First Run Product | Wash Product |
|---|---|---|---|
| Gasoline ($C_4$–$C_{14}$) | 11 | 5.0 | 3.4 |
| Diesel ($C_9$–$C_{24}$) | 20 | 40.9 | 67.6 |
| Oil ($C_{18}$—$C_{34}$) | 69 | 54.1 | 29.0 |

Elemental analyses for C, H, N, and S were performed on the starting material, first-run product, and wash product, on a Perkin-Elmer elemental analyzer, with results shown in Table II.

TABLE II

Elemental Analyses

| | Element | Test 1 | Test 2 | Test 3 | Average |
|---|---|---|---|---|---|
| Starting Material | C | 78.80% | 78.86% | 81.02% | 79.56% |
| | H | 11.26% | 11.40% | 11.81% | 11.49% |
| | N | 4.95% | 4.95% | 5.34% | 5.08% |
| | S | 4.91% | 4.26% | 4.29% | 4.49% |
| First Run Product | C | 77.58% | 78.95% | 77.83% | 78.12% |
| | H | 11.42% | 11.67% | 11.71% | 11.60% |
| | N | 4.99% | 5.02% | 4.81% | 4.94% |
| | S | 4.15% | 4.12% | 4.18% | 4.15% |
| Wash Product | C | 61.07% | 67.69% | 64.76% | 64.51% |
| | H | 11.03% | 11.15% | 10.66% | 10.95% |
| | N | 3.96% | 4.15% | 4.10% | 4.07% |
| | S | 3.46% | 3.66% | 3.54% | 3.55% |

Sulfur analyses were also performed by oxidizing a 0.1 g sample with 50 mL of 50% hydrogen peroxide (diluted to 500 mL), refluxing for 6 hours until clear, then analyzing the oil fractions for sulfate by ionic chromatography and the water fractions by ICP (inductively coupled plasma spectroscopy). The results, expressed as elemental sulfur, are listed in Table III.

TABLE III

Sulfur Content

| Sample | S Content (mg/kg) |
|---|---|
| Starting Material | 615 |
| First Run Product | 453 |
| Wash Product | 50 |
| First Run Aqueous Phase | 13.4 |
| Wash Water | 17.3 |

The foregoing is offered primarily for purposes of illustration. Further variations in the components of the apparatus and system, their arrangement, the materials used, the operating conditions, and other features disclosed herein that are still within the scope of the invention will be readily apparent to those skilled in the art.

What is claimed is:

1. Apparatus for generating ultrasonic vibration, said apparatus comprising:
 an ultrasonic horn,
 an ultrasonic transducer operatively joined to said ultrasonic horn to generate mechanical vibrations and to transmit vibrations so generated to said ultrasonic horn, said ultrasonic transducer comprising:
  first and second drive prongs of magnetostrictive material wound with drive coils, said drive coils arranged to produce magnetostrictive forces in said drive prongs in response to voltages applied across said drive coils, and
  a sensing magnet of magnetostrictive material wound with a sensing coil, said sensing magnet arranged such that vibrations produced in said drive prongs as a result of said magnetostrictive forces are transmitted to said sensing magnet and generate an oscillating voltage in said sensing coil,
 a power source for supplying periodically varying voltages across said drive coils, and
 control means for detecting a maximum voltage generated in said sensing coils, comparing said maximum voltage with a target value, and adjusting said voltages applied across said drive coils as needed to achieve said target value.

2. Apparatus in accordance with claim 1 in which said drive prongs are each from about 5 to about 50 cm in length and from about 100 to about 1,000 $cm^3$ in volume.

3. Apparatus in accordance with claim 1 in which said drive prongs are each from about 10 to about 25 cm in length and from about 250 to about 500 $cm^3$ in volume.

4. Apparatus in accordance with claim 1 in which said sensing magnet comprises first and second sensing prongs.

5. Apparatus in accordance with claim 4 in which said sensing prongs are each from about 5 to about 50 cm in length and from about 10 to about 300 $cm^3$ in volume.

6. Apparatus in accordance with claim 4 in which said sensing prongs are each from about 10 to about 25 cm in length and from about 30 to about 100 $cm^3$ in volume.

7. Apparatus in accordance with claim 1 in which said drive coil wound around said first drive prong and said drive coil wound around said second drive prong are coiled in opposite directions.

8. Apparatus in accordance with claim 1 in which said drive prongs are joined by a crossbar to form a U-shaped member.

9. Apparatus in accordance with claim 4 in which said sensing prongs are joined by a crossbar to form a U-shaped member.

10. Apparatus in accordance with claim 9 in which said sensing coil is a continuous coil wound around both prongs of said U-shaped member in series.

11. Apparatus in accordance with claim 4 in which said drive prongs are joined by a crossbar to form a U-shaped drive member and said sensing prongs are joined by a crossbar to form a U-shaped sensing member, each U-shaped member comprised of a plurality of plates of a soft magnetic alloy joined together.

12. Apparatus in accordance with claim 1 further comprising cooling jacket surrounding said ultrasonic transducer and means for passing a coolant medium through said cooling jacket.

13. Apparatus in accordance with claim 1 in which said ultrasonic horn is a solid metallic rod of circular cross section.

14. Apparatus in accordance with claim 13 in which said metallic rod is comprised of a member selected from the group consisting of aluminum and titanium.

15. Apparatus in accordance with claim 1 in which said power source supplies a pulsewise voltage at a frequency of from about 10 to about 30 megahertz and a wattage of from about 12 to about 20 kilowatts.

16. Apparatus in accordance with claim 15 in which said frequency is from about 17 to about 20 megahertz.

17. Apparatus in accordance with claim 1 in which said power source supplies a pulsewise voltage and said target value is from about 140 to about 300 volts.

18. Apparatus in accordance with claim 1 in which said power source supplies voltage in a rectangular waveform alternating between positive and negative voltages of approximately equal magnitude.

19. A flow-through reactor for the continuous treatment of a liquid material with ultrasound, said flow-through reactor comprising:

- a reaction vessel with entry and exit ports,
- an ultrasonic horn mounted to said reaction vessel and extending into the interior thereof,
- an ultrasonic transducer operatively joined to said ultrasonic horn to generate mechanical vibrations and to transmit vibrations so generated to said ultrasonic horn, said ultrasonic transducer comprising:
  - first and second drive prongs of magnetostrictive material wound with drive coils, said drive coils arranged to produce magnetostrictive forces in said drive prongs in response to voltages applied across said drive coils, and
  - a sensing magnet of magnetostrictive material wound with a sensing coil, said sensing magnet arranged such that vibrations produced in said drive prongs as a result of said magnetostrictive forces are transmitted to said sensing magnet and generate an oscillating voltage in said sensing coil,
- a power source for supplying periodically varying voltages across said drive coils, and
- control means for detecting a maximum voltage generated in said sensing coils, comparing said maximum voltage thus detected with a target value, and adjusting said voltages applied across said drive coils as needed to achieve said target value.

20. A flow-through reactor in accordance with claim 19 in which said drive prongs are each from about 5 to about 50 cm in length and from about 100 to about 1,000 $cm^3$ in volume.

21. A flow-through reactor in accordance with claim 19 in which said drive prongs are each from about 10 to about 25 cm in length and from about 250 to about 500 $cm^3$ in volume.

22. A flow-through reactor in accordance with claim 19 in which said sensing magnet comprises first and second sensing prongs.

23. A flow-through reactor in accordance with claim 22 in which said sensing prongs are each from about 5 to about 50 cm in length and from about 50 to about 300 $cm^3$ in volume.

24. A flow-through reactor in accordance with claim 22 in which said sensing prongs are each from about 50 to about 25 cm in length and from about 30 to about 100 $cm^3$ in volume.

25. A flow-through reactor in accordance with claim 22 in which said drive coil wound around said first drive prong and said drive coil wound around said second drive prong are coiled in opposite directions, and said sensing coil is a continuous coil wound around said first and second sensing prongs in series.

26. A flow-through reactor in accordance with claim 22 in which said drive prongs are joined by a crossbar to form a U-shaped drive member and said sensing prongs are joined by a crossbar to form a U-shaped sensing member, each U-shaped member comprised of a plurality of plates of a soft magnetic alloy joined together.

27. A flow-through reactor in accordance with claim 22 in which said drive prongs and said sensing prongs are each from about 5 cm to about 50 cm in length.

28. A flow-through reactor in accordance with claim 19 in which said power source supplies a pulsewise voltage at a frequency of from about 50 to about 30 megahertz and a wattage of from about 12 to about 20 kilowatts.

29. A flow-through reactor in accordance with claim 28 in which said frequency is from about 17 to about 20 megahertz.

30. A flow-through reactor in accordance with claim 19 in which said power source supplies a rectangular waveform voltage and said target value is from about 140 to about 300 volts.

31. A flow-through reactor in accordance with claim 19 in which said power source supplies a rectangular waveform voltage alternating between positive and negative voltages of approximately equal magnitude.

32. A method for performing a chemical reaction enhanced by ultrasound, said method comprising passing material to be reacted, in liquid form, through an ultrasound chamber in which said material is exposed to ultrasound generated by an ultrasonic transducer comprising:

- first and second drive prongs of magnetostrictive material wound with drive coils, said drive coils arranged to produce magnetostrictive forces in said drive prongs in response to voltages applied across said drive coils, and
- a sensing magnet of magnetostrictive material wound with a sensing coil, said sensing magnet arranged such that vibrations produced in said drive prongs as a result of said magnetostrictive forces are transmitted to said sensing magnet and generate an oscillating voltage in said sensing coil, by applying periodically varying voltages across said drive coils while detecting voltages generated in said sensing coils, comparing voltages thus detected with a target value, and adjusting said voltages applied across said drive coils as needed to achieve said target value.

33. A method in accordance with claim 32 in which said target value is from about 150 to about 300 volts.

34. A method in accordance with claim 32 in which said periodically varying voltages are a pulsewise voltage at a frequency of from about 50 to about 30 megahertz and a wattage of from about 12 to about 20 kilowatts.

35. A method in accordance with claim 34 in which said frequency is from about 17 to about 20 megahertz.

36. A method in accordance with claim 32 in which said periodically varying voltages are a rectangular waveform voltage alternating between positive and negative voltages of approximately equal magnitude.

37. A method in accordance with claim 32 in which said drive prongs are each from about 5 to about 50 cm in length and from about 100 to about 1,000 $cm^3$ in volume.

38. A method in accordance with claim 32 in which said drive prongs are each from about 50 to about 25 cm in length and from about 250 to about 500 $cm^3$ in volume.

39. A method in accordance with claim 32 in which said sensing magnet is comprised of first and second sensing prongs.

40. A method in accordance with claim 39 in which said sensing prongs are each from about 5 to about 50 cm in length and from about 50 to about 300 $cm^3$ in volume.

41. A method in accordance with claim 39 in which said sensing prongs are each from about 50 to about 25 cm in length and from about 30 to about 100 $cm^3$ in volume.

42. A method in accordance with claim 39 in which said drive coil wound around said first drive prong and said drive coil wound around said second drive prong are coiled in opposite directions, and said sensing coil is a continuous coils wound around said first and second sensing prongs in series.

43. A method in accordance with claim 39 in which said drive prongs are joined by a crossbar to form a U-shaped drive member and said sensing prongs are joined by a crossbar to form a U-shaped sensing member, each U-shaped member comprised of a plurality of plates of a soft magnetic alloy joined together.

* * * * *